(12) United States Patent
Romas, Jr. et al.

(10) Patent No.: US 6,586,985 B1
(45) Date of Patent: Jul. 1, 2003

(54) METHODS AND APPARATUS FOR TRIMMING PACKAGED ELECTRICAL DEVICES

(75) Inventors: Gregory G. Romas, Jr., McKinney, TX (US); Jian Wang, McKinney, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/122,608

(22) Filed: Apr. 12, 2002

(51) Int. Cl.[7] .............................................. H01H 37/76
(52) U.S. Cl. ...................................................... 327/525
(58) Field of Search ............................... 327/306, 308, 327/524, 525

(56) References Cited

U.S. PATENT DOCUMENTS

| | | | |
|---|---|---|---|
| 4,412,241 A | | 10/1983 | Nelson |
| 4,451,839 A | | 5/1984 | Nelson |
| 4,683,386 A | * | 7/1987 | Kamikawara ............... 327/308 |
| 5,079,516 A | | 1/1992 | Russell et al. |
| 5,361,001 A | * | 11/1994 | Stolfa ......................... 327/530 |
| 6,157,241 A | | 12/2000 | Hellums |
| 6,166,589 A | * | 12/2000 | Park ............................ 327/540 |
| 6,255,895 B1 | * | 7/2001 | Kim et al. ................... 327/530 |

* cited by examiner

*Primary Examiner*—Jeffrey Zweizig
(74) *Attorney, Agent, or Firm*—Rose Alyssa Keagy; W. James Brady, III; Frederick J. Telecky, Jr.

(57) ABSTRACT

An electrical device is disclosed, comprising electrical components forming an electrical circuit, with a trim circuit comprising two or more trim cells providing selectively removable resistances between first and second nodes in the electrical circuit. The resistance between the nodes is trimmed incrementally by application of trim signals to a single pair of terminals or pads on the device, allowing post-packaging trimming. Methods are also disclosed for selective removal of resistance between first and second nodes in a packaged electrical device.

26 Claims, 16 Drawing Sheets

METHODS AND APPARATUS FOR TRIMMING PACKAGED ELECTRICAL DEVICES

FIELD OF INVENTION

The present invention relates generally to electronic devices and more particularly to improved trim circuitry and methods for trimming electrical devices before and/or after packaging.

BACKGROUND OF THE INVENTION

Trim circuits are found in many types of electrical devices where a voltage, current, or other operational parameter of a device needs to be adjusted, either during or following manufacturing. Such trim circuitry typically provides a resistance between two nodes in an integrated circuit device, which may be selectively removed, in whole or in part, from the circuit upon application of voltages or currents to trim pads in the device. Trim circuits often employ zener diodes connected in parallel with the resistor to be removed, where the application of an appropriate trim voltage across the diode terminals short-circuits the resistor, sometimes referred to as "blowing" the diode. Other trim circuits selectively employ open-circuits to adjust the device performance. In this instance, fuses are often formed in the trim circuit, which can be selectively open circuited by conducting a fuse trim current through the fuse, sometimes referred to as "blowing" the fuse.

Resistive trim circuits are employed in a variety of electrical devices, including voltage reference or voltage regulator devices wherein one or more reference voltages generated by the device are adjusted during the manufacturing process. In the case of high precision reference voltage trimming, multiple trim cells are often employed to allow precise adjustment to the voltage of interest. This is commonly implemented by cascading a number of conventional parallel resistor/diode trim cells in series, with probe pads provided between each such trim cell to allow application of trim voltages to the individual cells. Thus, where N such trim cells are configured in series, N+1 pads are needed to allow selective access for trimming the individual cells. However, each probe pad occupies a significant amount of surface area in the device die, thereby limiting the area available for other devices. Thus, it is desirable to provide electrical devices having multi-bit trim circuitry occupying less overall real estate than the series configuration of multiple conventional trim cells.

In a typical trimming operation, pre-packaging probing is performed using test systems capable of probing conductive trim pads on the surface of the device die, either before or after separation of individual dies from a wafer. The test system measures the reference voltage and applies trim voltages to appropriate pairs of trim pads to selectively change the resistance affecting the reference voltage. The reference voltage is again measured, and if further trimming is desired, the process is repeated, with additional diodes being blown to remove further resistance and thereby provide further adjustment of the reference voltage. However, since packaged voltage regulator devices typically include only a small number of external pins or terminals (e.g., 3), mutli-bit trimming has thusfar been performed exclusively prior to packaging.

Electrical devices are commonly available in a wide variety of package sizes and types, for example, providing different footprint sizes and thermal cooling capabilities for both thru-hole and surface mount applications. In the case of voltage regulator devices, different package options are available, typically providing three terminals for an LM317 type regulator. However, the packaging process itself can cause changes in the device performance, which sometimes affects the reference voltage in a regulator device.

In this regard, the cooling of molding compound around the device die during packaging has been found to cause physical stress to the die and the components thereof. This stress in turn may cause a shift in an operational parameter in a device, such as the reference voltage value in a voltage regulator. In addition, the stress related reference voltage shift is different for different package types. Moreover, as device package sizes continue to decrease, the stress on the device dies increases. As a result, the stress-induced reference voltage shift is more pronounced. Accordingly, there is a need for trim circuits and methodologies allowing multi-bit trimming of voltage regulators and other electrical devices which compensate for stress-related changes in device performance.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later.

The present invention provides methods and apparatus.for trimming electrical devices, which may be employed before or after device packaging. Thus, the invention may be employed to compensate for device performance changes resulting from packaging processes. In addition, the invention facilitates trimming of devices in multi-bit fashion, through application of one or more trim signals to a single pair of pads or terminals on the device. Thus, the trim apparatus of the invention provides multi-bit trimming while occupying less die space than prior multi-bit trimming circuitry. In one example illustrated and described below, a reference voltage in a three-terminal voltage regulator device may be adjusted through mutli-bit resistor trimming using an output terminal and an adjust terminal thereof after the device is packaged. Thus, the invention facilitates multi-bit adjustment to compensate for shifting in an operational parameter caused by packaging processes to improve the manufacturability of such devices with current packaging processes and materials.

One aspect of the invention provides an electrical device, comprising an electrical circuit with a plurality of electrical terminals or pins, and a trim circuit comprising one or more trim cells fabricated in the device substrate. The trim cells individually provide resistance between first and second nodes in the electrical circuit, where the resistance of the individual trim cells are selectively removable by application of a trim signal to first and second electrical terminals. In one implementation, application of a trim voltage to output and adjust pins or terminals of a voltage regulator device removes (e.g., short-circuits) a resistance from a trim cell nearest the adjust terminal. Subsequent application of a trim current to the output and adjust terminals disconnects the trim cell from the output terminal, to allow access to an adjacent trim cell in the trim circuit. The process may then be repeated if further resistance removal is desired, in order to bring the reference voltage within an acceptable range.

The trim cells individually comprise a resistor, providing a resistance between the first and second circuit nodes and a diode comprising an anode connected to an end of the resistor, a cathode, and a conductive portion connected to the cathode. The resistors of the individual trim cells are connected in series between the first and second circuit nodes, with the cathodes connected to the second trim terminal or pad. The first terminal is connected to the first circuit node, allowing access to the trim cells to trim one cell at a time, beginning with the trim cell closest to the first terminal. Application of a trim voltage across the terminals causes the conductive portion of the cell diode or that of an adjacent contact to electrically short-circuit the resistor. The trim cells may further comprise a fuse connected between the conductive portion of the diode and the second terminal to selectively disconnect the cathode from the second terminal after application of a trim current between terminals. This allows trimming of one cell at a time, with the trim voltage shorting the cell resistor, and the trim current disconnecting the trimmed cell from the second terminal, to allow trimming of the next cell, if desired.

Another aspect of the invention involves methods for selectively removing resistance between first and second nodes in a packaged electrical device. The methods may be employed in association with voltage regulators or other devices having first and second terminals associated with one or more trim cells in the device. The method comprises applying a trim voltage across the first and second terminals to short a first resistor, and applying a trim current between the first and second terminals to disconnect a first trim cell from the second terminal. The method may further comprise measuring an operating parameter associated with the electrical device, such as a reference voltage of a voltage regulator device, and determining if further trimming is desired according to the measured operating parameter. If further trimming is desired, the method provides for applying a second trim voltage across the terminals to short a second resistor, and applying a trim current between the terminals to disconnect a second trim cell from the second terminal.

To the accomplishment of the foregoing and related ends, the following description and annexed drawings set forth in detail certain illustrative aspects and implementations of the invention. These are indicative of but a few of the various ways in which the principles of the invention may be employed. Other aspects, advantages and novel features of the invention will become apparent from the following detailed description of the invention when considered in conjunction with the drawings.

DETAILED DESCRIPTION OF THE INVENTION

Figure 1:
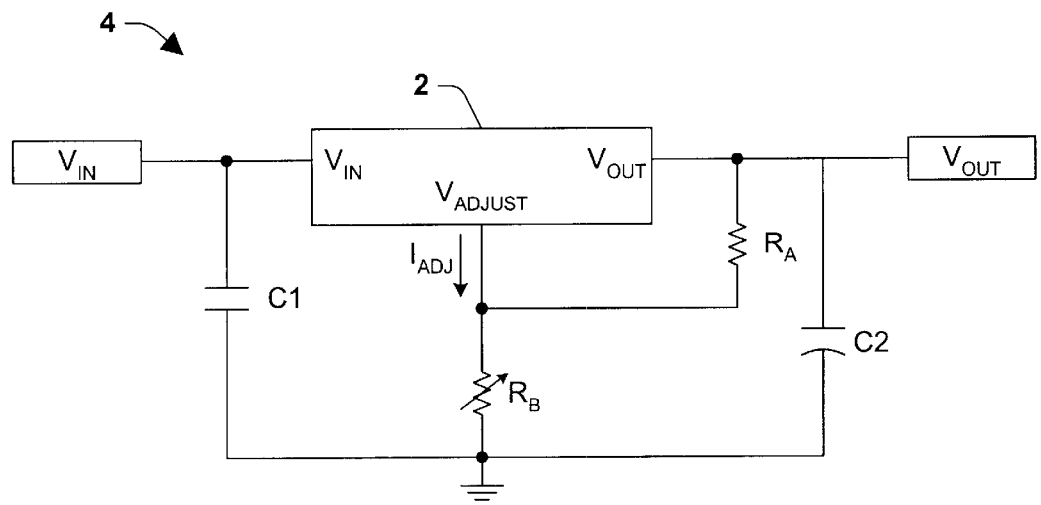
FIG. 1 is a schematic diagram illustrating a DC power supply circuit with a voltage regulator device to provide an adjustable DC output voltage in which one or more aspects of the present invention may be employed.

The present invention will now be described with reference to the attached drawings, wherein like reference numerals are used to refer to like elements throughout. The invention relates to electrical devices and methods for trimming such, in which multi-bit trimming may be accomplished before and/or after device packaging using a single pair of terminals or pins on the device. The invention is illustrated and described below in the context of voltage regulator devices in which multi-bit trimming is accomplished before and/or after packaging using an output terminal and an adjust terminal. However, it is noted that the invention finds utility in association with other types of electrical devices, such as precision references, operational amplifiers, or the like, and is not limited by the implementations illustrated and described herein.

In FIG. 1, an LM317 type voltage regulator device 2 is illustrated in an adjustable DC power supply circuit 4, in which various aspects of the invention may be implemented. The regulator 2 comprises an input terminal connected to a DC input voltage $V_{IN}$, an output terminal $V_{OUT}$, and an adjust terminal $V_{ADJUST}$. A first resistor $R_A$ is connected between the output and adjust terminals $V_{OUT}$ and $V_{ADJUST}$, respectively, and a second resistor $R_B$ is connected between the adjust terminal $V_{ADJUST}$ and ground. A first capacitor C1 is connected between the input $V_{IN}$ and ground, and a second capacitor C2 is connected from the output $V_{OUT}$ to ground. The resistor $R_B$ is adjustable to provide adjustment of the output voltage $V_{OUT}$, which is related to a 1.25 volt reference voltage $V_{REF}$ maintained by the regulator device 2 between the $V_{OUT}$ and $V_{ADJUST}$ terminals as $V_{OUT} = V_{REF}(1+R_B/R_A)+I_{ADJ}*R_B$. $I_{ADJ}$ is typically 50 μA, where $R_A$ and $R_B$ may be set to 240 OHMs and 1–5 kOHMs, respectively, to provide an output voltage $V_{OUT}$ adjustable between about 3–25 volts when supplied with an input voltage $V_{IN}$ of about 28 volts DC.

Figure 2:
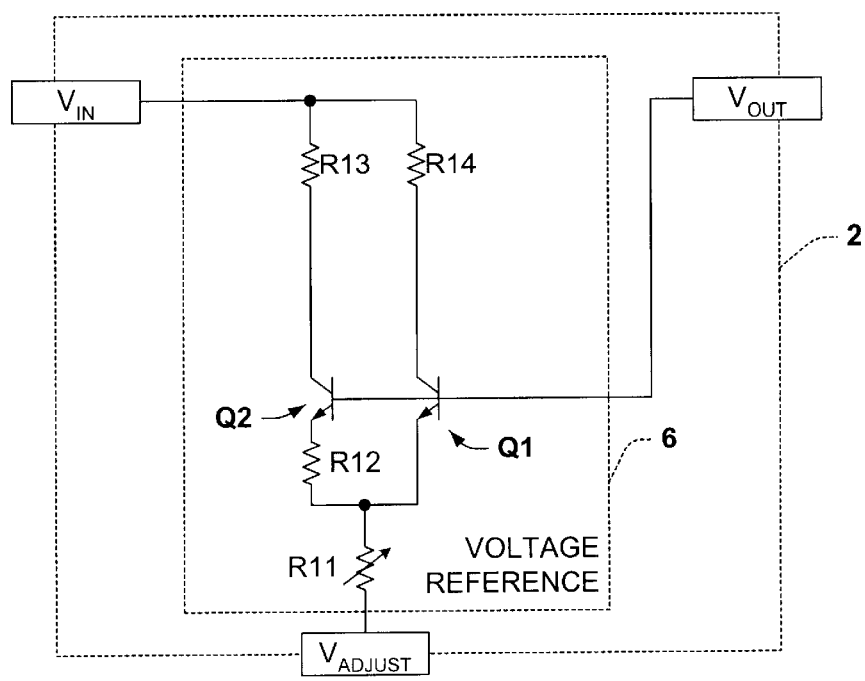
FIG. 2 is a schematic diagram illustrating the voltage regulator device of FIG. 1.

Referring also to FIG. 2, the voltage regulator device 2 is schematically illustrated comprising a voltage reference 6 employing a Brokaw cell type bandgap circuit with transistors Q1 and Q2 having connected bases providing the output $V_{OUT}$ at a constant reference voltage value (e.g., 1.25 volts DC) above the voltage at the $V_{ADJUST}$ terminal. The area of the transistor Q2 is an integer number N times larger than the area of the transistor Q1 according to known bandgap circuit design techniques. The emitters of the transistors Q1 and Q2 are connected to one another through a resistor R12 and an adjustable resistor R11 is connected between the emitter of Q1 and the $V_{ADJUST}$ terminal, wherein the collectors are connected to the input voltage $V_{IN}$ through equal size load resistors R13 and R14. The transistors Q1 and Q2, in conjunction with R11 and R12, form a self-biased differential pair providing the voltage reference between $V_{OUT}$ and $A_{DJUST}$ at a constant value.

The value (e.g., 1.25 volts DC) of the reference voltage between $V_{OUT}$ and $V_{ADJUST}$ is set according to the values of the resistors R11 and R12, wherein the resistance R11 is adjustable in the device 2. This adjustability in R11 allows precise adjustment of the reference voltage value during manufacturing, wherein an increase in R11 provides an increase in the reference voltage between the $V_{OUT}$ and $V_{ADJUST}$ terminals. In the illustrated implementation, the resistor R12 is about 2.4 kOHMs and R11 is about 12 kOHMs and is adjustable for fine tuning the reference voltage value. In conventional voltage regulator devices employing bandgap type reference voltage cells, the reference voltage provided by the reference circuit 6 is adjusted prior to device packaging, using test equipment accessing R11 through probe pads (not shown).

As illustrated in FIGS. 3A–3D, however, such voltage regulator devices are available in a wide variety of package sizes and types. The inventors have found that the cooling of molding compound around the device die during packaging causes physical stress to the die and the components thereof, resulting in a shift in the reference voltage value. Thus, although the resistor R11 may be adjusted by probing to set the value of the voltage reference 6, subsequent packaging may shift the value out of an acceptable range. In addition, the packaging-related stress and resulting reference voltage shift is different for different package types and sizes. In the case of voltage regulator devices, different package options are available, typically providing three terminals for an LM317 type regulator, as illustrated in FIGS. 3A–3D.

Figure 3A:
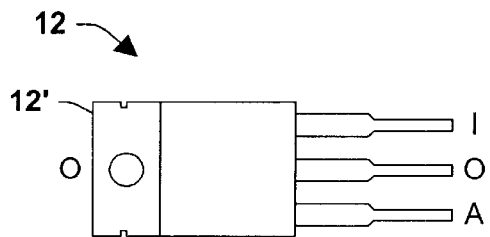
FIGS. 3A–3D are top plan views illustrating voltage regulators in TO-220, TO-39, TO-263, and TO-252 packages, respectively.
Figure 3B:
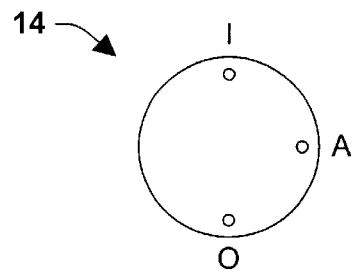
Figure 3C:
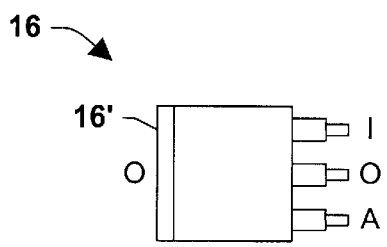
Figure 3D:
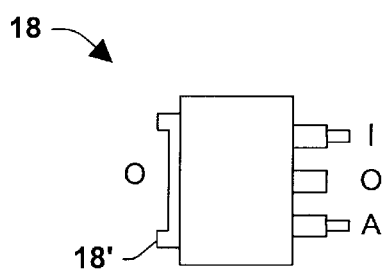

FIG. 3A illustrates an LM317 type voltage regulator 12 in a TO-220 package having an input terminal I, an output terminal O and an adjust terminal A, wherein a heat sink tab 12' is also connected to the output O. FIG. 3B illustrates a voltage regulator 14 in a TO-39 package having an input terminal I, an output terminal O and an adjust terminal A, and FIG. 3C illustrates a voltage regulator in a TO-263 surface mount package with an input terminal I, an output terminal O and an adjust terminal A, and a tab 16' connected to the output O. Similarly, FIG. 3D illustrates a voltage regulator in a surface mount TO-252 package having an input terminal I, an output terminal O and an adjust terminal A, with a tab 18' connected to the output O. It is noted in FIGS. 3A–3D that the provision of only three terminals in the voltage regulator devices 12, 14, 16, and 18 previously prevented post-packaging trimming of the resistor R11, whereby stress-related reference voltage shifting during packaging could lead to rejection of electrical devices.

Figure 4:
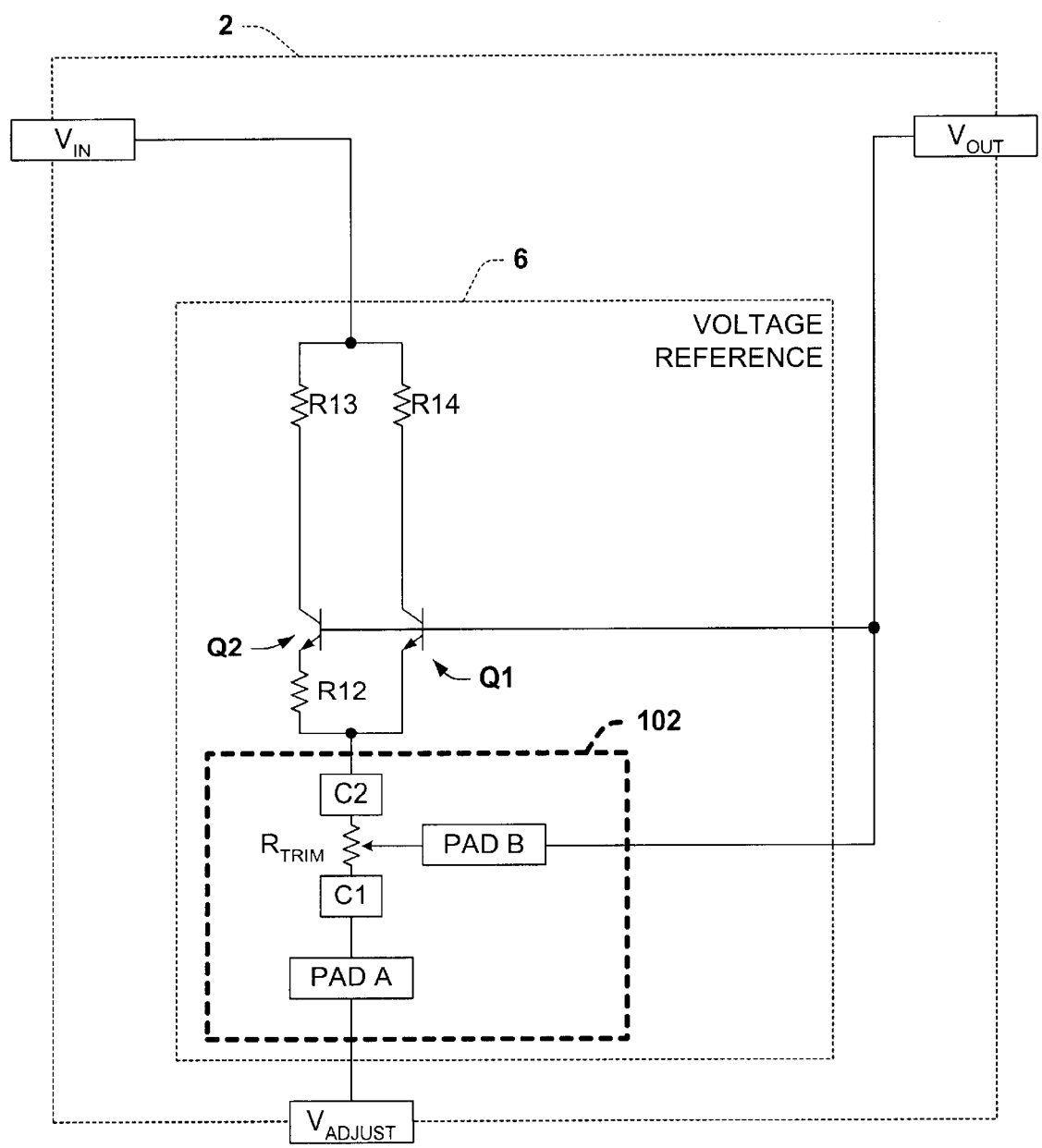
FIG. 4 is a schematic diagram illustrating a voltage regulator device comprising an exemplary multi-bit trim circuit in accordance with an aspect of the invention.

Referring now to FIG. 4, the invention provides electrical devices capable of being trimmed after packaging without requiring additional terminals. In addition, the invention allows multi-bit type post-packaging trimming for adjusting an operating parameter associated with electrical devices, such as the reference voltage in a voltage regulator device. FIG. 4 illustrates the exemplary voltage regulator device 2 with the bandgap cell voltage reference 6, wherein the adjustment resistor R11 of FIG. 2 is implemented using a trim circuit 102 in accordance with the present invention. The circuit 102 comprises an adjustable resistance $R_{TRIM}$ connected between a contact C2 at the emitter of the transistor Q1 and a contact C1 at the adjust terminal $V_{ADJUST}$. The trim circuit 102 may advantageously provide multi-bit trimming capability, as illustrated and described in greater detail below.

Trim pads A and B may optionally be provided in the die of the device 2 to allow probe type trimming prior to packaging, where application of one or more trim signals to the pads A and B provides for selective removal of resistance from the resistor $R_{TRIM}$. However, it is noted in FIG. 4 that the resistance $R_{TRIM}$ may be trimmed by accessing the pads A and B through the terminals $V_{OUT}$ and $V_{ADJUST}$, by which post-packaging trimming operation can be achieved. In this regard, where pre-packaging trimming is not employed, pads A and B need not be formed in the device 2, by which the area of the device die dedicated to the trim circuit 102 may be further reduced. In addition, the trim circuit 102 may be operated using a single pair of electrical connections, whether terminals $V_{OUT}$ and $V_{ADJUST}$ or pads A and. B, in order to perform multi-bit trimming. Thus, the trim circuit 102 provides significant space savings compared with multi-bit trim circuits comprising an integer number N conventional trim cells with the corresponding N+1 trim pads.

Figure 5:
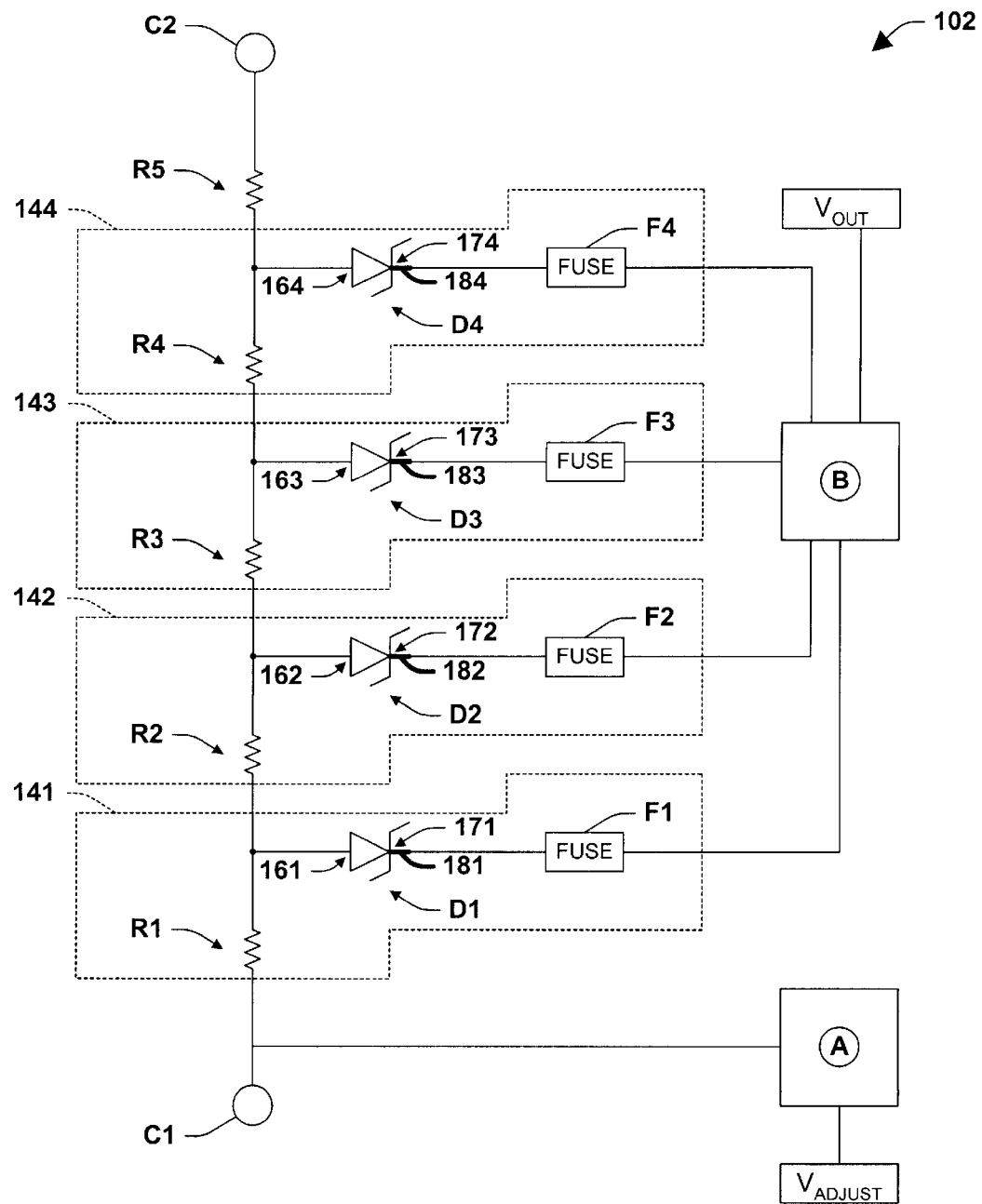
FIG. 5 is a schematic diagram illustrating an exemplary multi-bit trim circuit in accordance with another aspect of the present invention.

Detailed operation of the exemplary trim circuit 102 is illustrated and described hereinafter with respect to FIGS. 5–9B. It is noted at this point, however, that the illustrated trim circuit 102 is but one example, and that other trim circuits and trim cells therefor are contemplated as falling within the scope of the invention. In FIG. 5, the trim circuit 102 is illustrated comprising four trim cells 141–144 connected to provide individual selectively removable resistances R1–R4 in series between the first and second circuit nodes C1 and C2 in the device 2. While the exemplary trim circuit 102 comprises four such trim cells 141–144, any number of such cells are contemplated within the scope of the invention.

In the illustrated example of the voltage regulator device 2, the removal of incremental amounts of resistance from $R_{TRIM}$ between the nodes C1 and C2 allows incremental adjustment to (e.g., reduction in) the value of the reference voltage between the output and adjust terminals $V_{OUT}$ and $V_{ADJUST}$. The incremental removal of resistance in the trim circuit 102 is accomplished through application of appropriate trim voltages and currents to first and second trim pads A and B in a pre-packaging trim operation. Separately or in combination, the trim circuit 102 may be trimmed after device packaging, wherein such trim signals are applied to the output and adjust pins or terminals $V_{OUT}$ and $V_{ADJUST}$, respectively, of the electrical device 2.5

The trim cells 141–144 initially comprise resistors R1–R4, zener diodes D1–D4, and fuses F1–F4, respectively, wherein the trim cell resistors R1–R4 are serially connected with a fixed resistor R5 between the nodes C1 and C2. The first node C1 is connected to the first trim pad A (and the terminal $V_{ADJUST}$) and the fuses F1–F4 initially connect the trim cells 141–144 to the second trim pad B (and the terminal $V_{OUT}$), respectively. In the circuit 102, the fuses F1–F4 provide temporary conductive paths through the cells 141–144 to allow application of trim voltages thereto in order to selectively short-circuit one or more of the cell resistors R1–R4 on an as-needed basis. This, in turn, facilitates provision of a desired final resistance between the circuit nodes C1 and C2 (e.g., and hence a desired reference voltage value), as described in greater detail hereinafter.

Figure 6A:
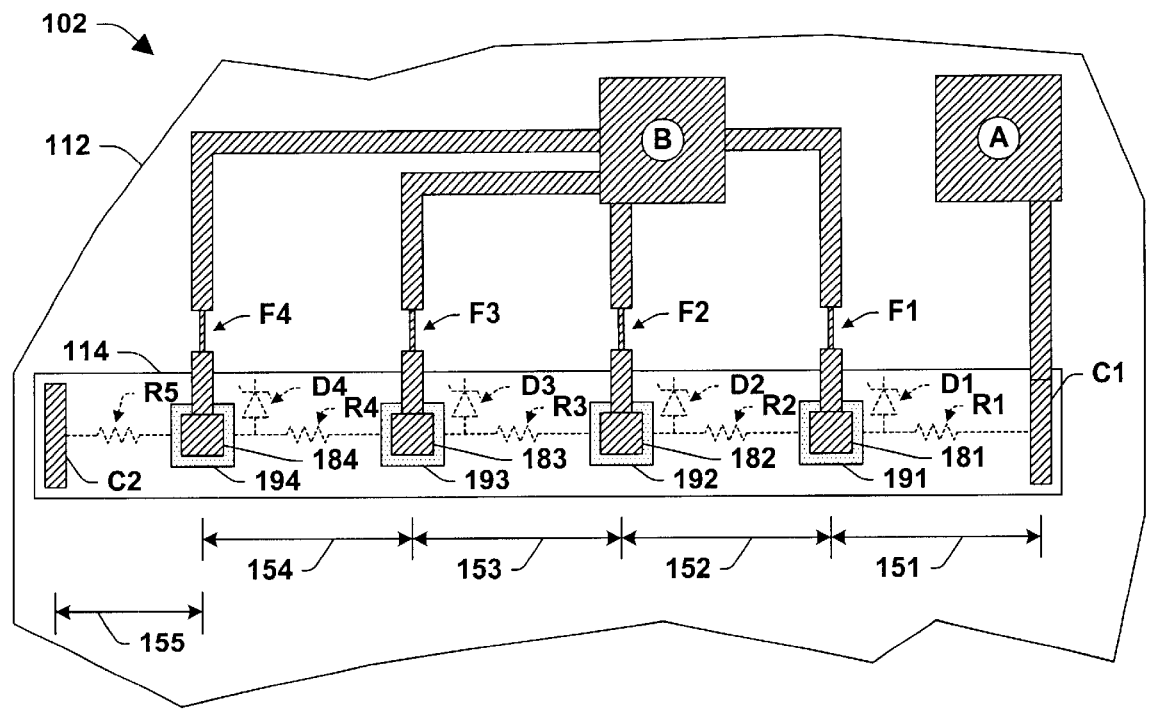
FIGS. 6A and 6B are partial top plan and side elevation views illustrating one implementation of the multi-bit trim circuit of FIG. 5.
Figure 6B:
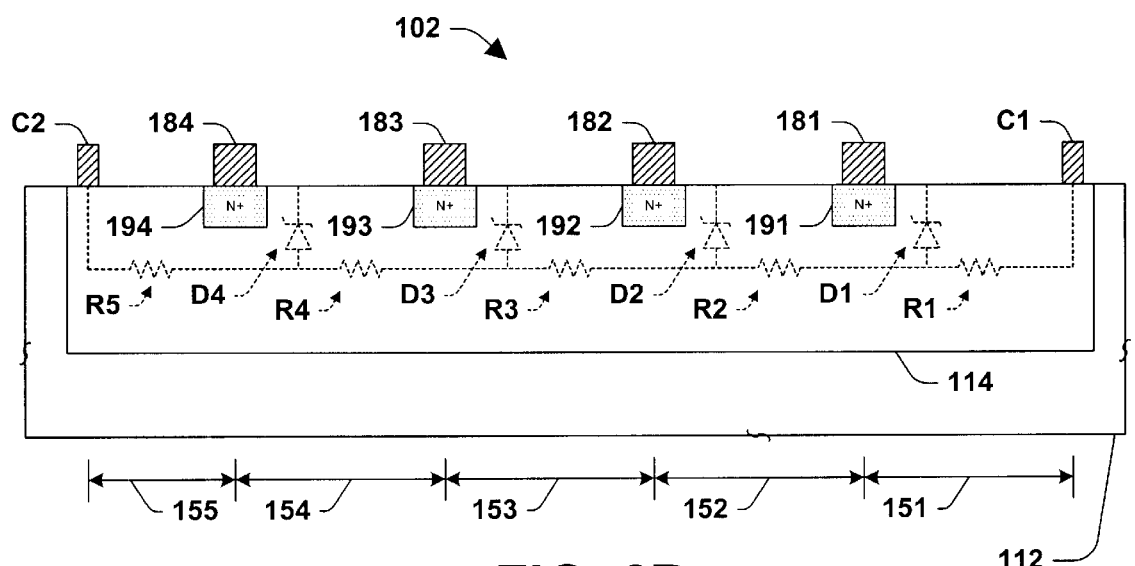

Referring also to FIGS. 6A and 6B, the trim cell resistors R1–R4, as well as the fixed resistor R5 are formed in a common P type doped resistor body 114 extending in an N type doped substrate 112 along corresponding lengths 151–155. The electrical resistances R1–R5 of the resistor body 114 along the lengths 151–155 contribute to the total initial resistance $R_{TRIM}$ between the circuit nodes C1 and C2 prior to trimming. Alternatively, the trim resistors R1–R4 and/or the fixed resistor R5 may individual comprise separate resistor bodies (not shown) in the substrate 112. The trim cell zener diodes D1–D4 are formed in the composite resistor body 114, comprising anodes 161–164, cathodes 171–174, and conductive portions 181–184 connected to the cathodes 171–174, respectively. As illustrated in FIGS. 6A and 6B, the diodes D1–D4 comprise diode body portions 191–194, respectively, formed as N+ doped regions in the resistor body 114. The conductive portions 181–184 comprise conductive contact structures 181–184 formed over the diode body portions 191–194, respectively. The contact structures 181–184 are connected to the second trim pad B and the output terminal $V_{OUT}$ through the fuses F1–F4.

Figure 7A:
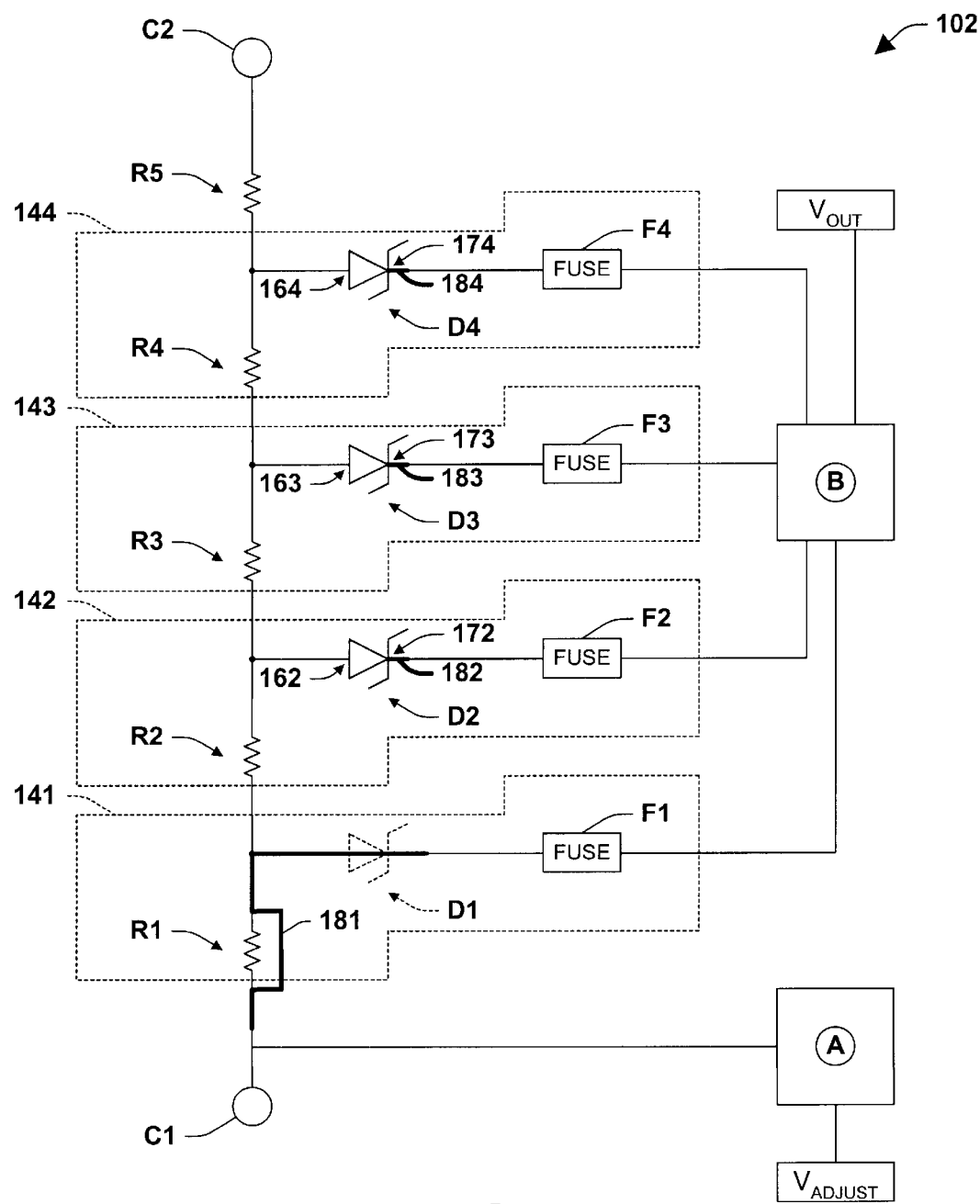
FIG. 7A is a schematic diagram illustrating the trim circuit of FIG. 5 with a first diode destroyed and a first resistor short-circuited.
Figure 7B:
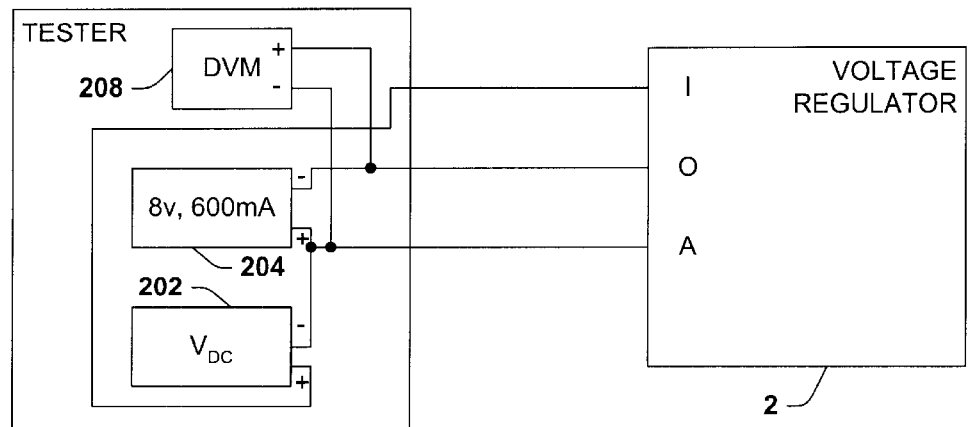
FIG. 7B is a schematic diagram illustrating an exemplary system for trimming an electrical device providing a trim voltage to short-circuit the first resistor in the trim circuit of FIG. 7A.
Figure 7C:
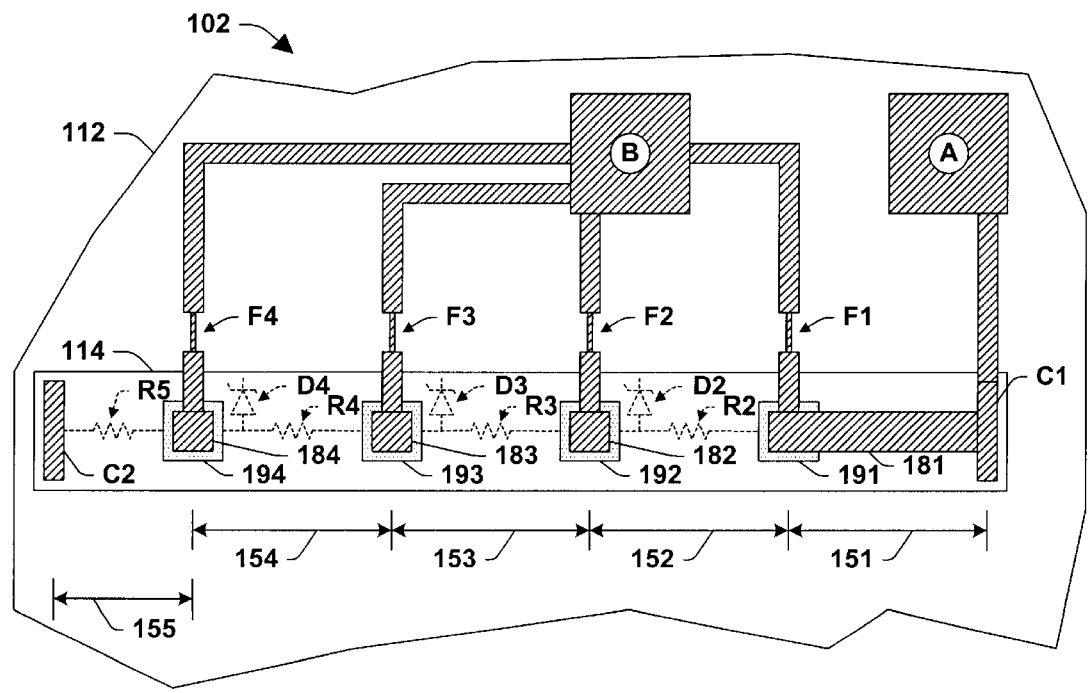
FIG. 7C is a partial top plan view illustrating the trim circuit of FIG. 7A with the first resistor short-circuited.
Figure 7D:
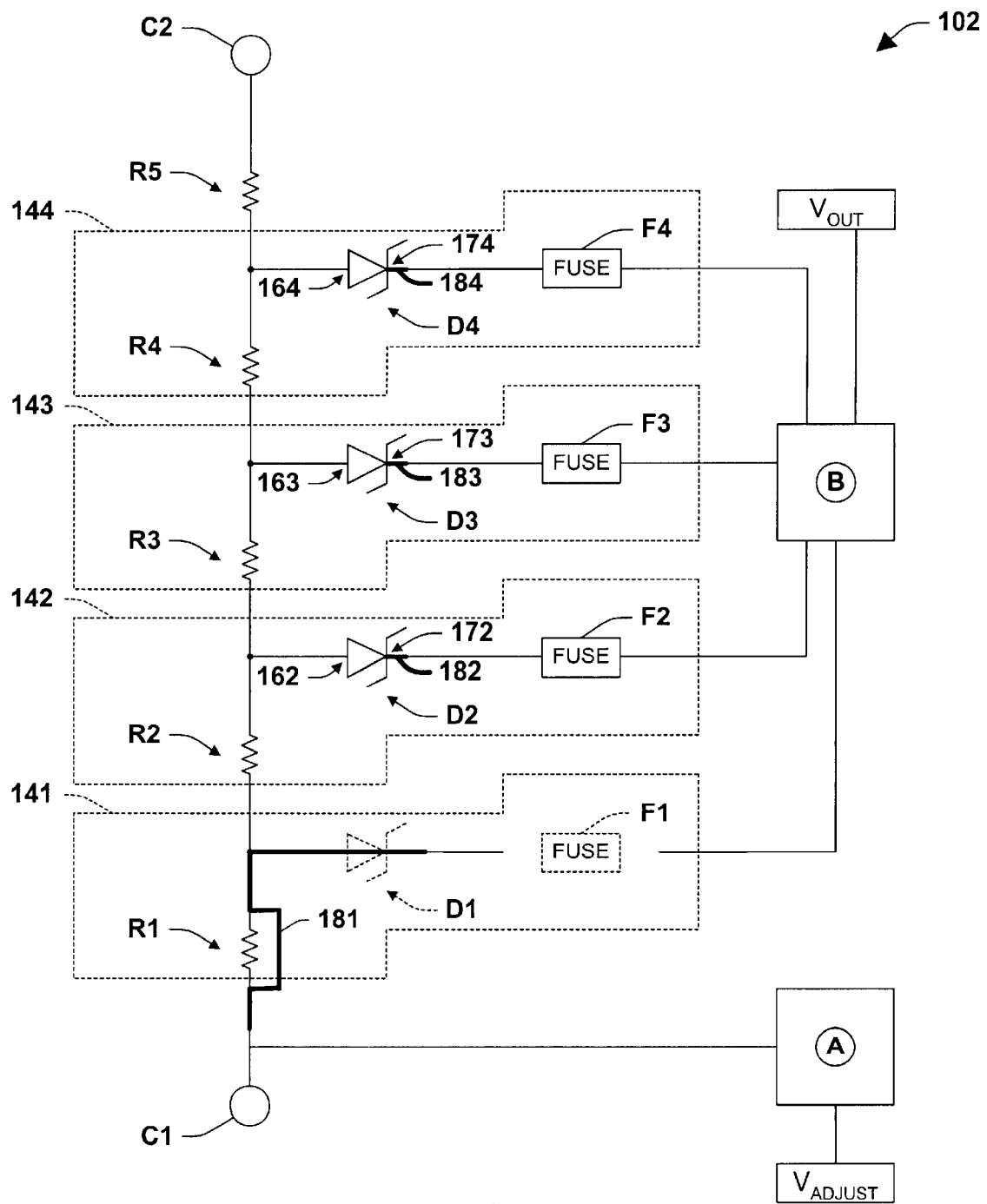
FIG. 7D is a schematic diagram illustrating the trim circuit of FIG. 7A with a first fuse opened to disconnect a first trim cell from the second terminal.
Figure 7E:
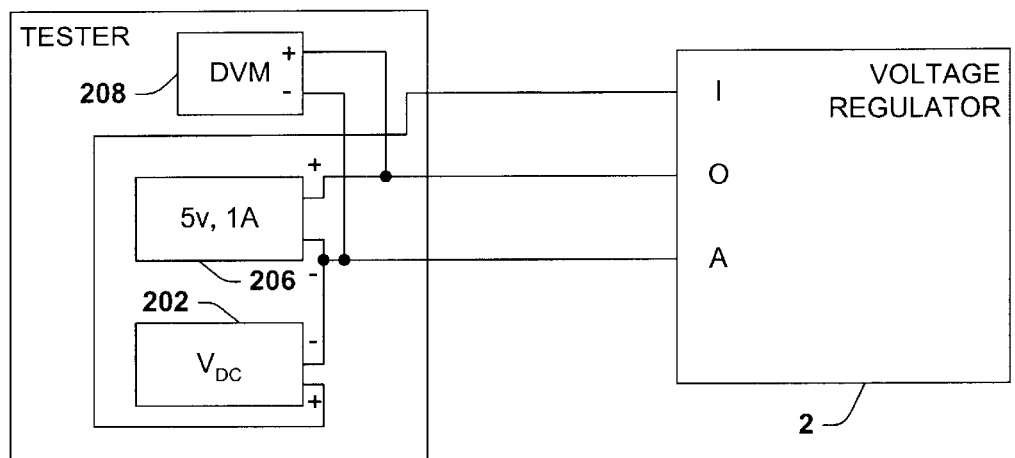
FIG. 7E is a schematic diagram illustrating the system of FIG. 7B configured to provide a trim current to open the first fuse in the trim circuit of FIG. 7D.
Figure 7F:
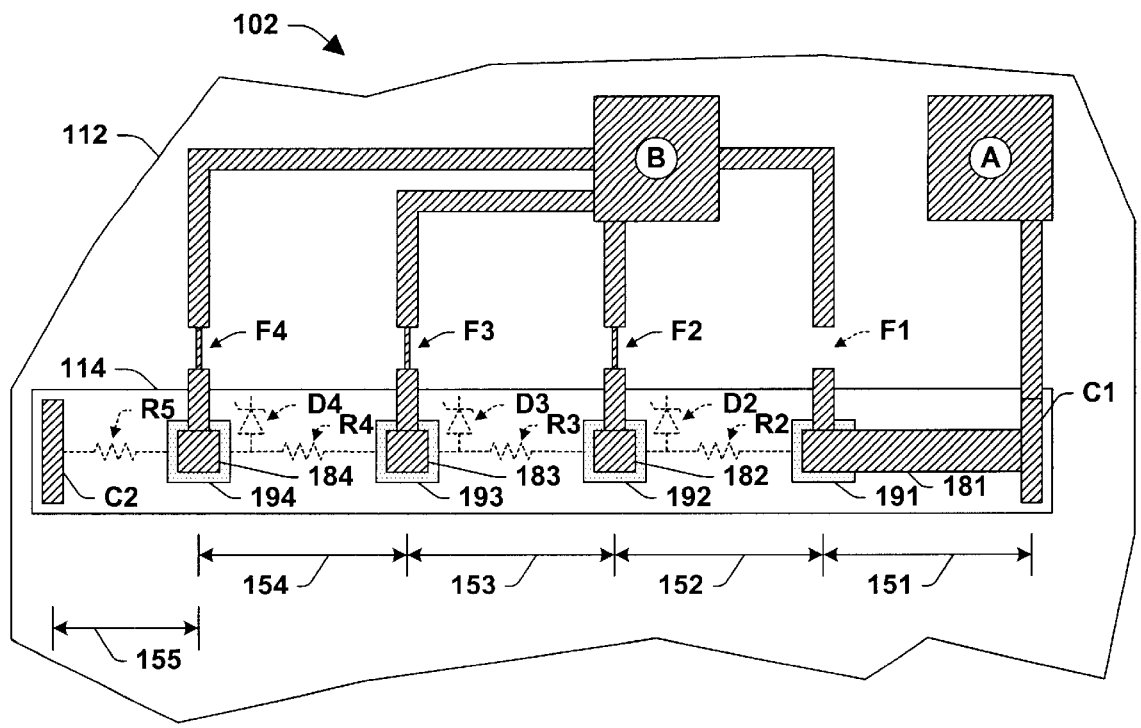
FIG. 7F is a partial top plan view illustrating the trim circuit of FIG. 7D with the first fuse opened.

In operation, the trim circuit 102 may be used to adjust the total resistance between the nodes C1 and C2, and hence the reference voltage value of the voltage reference 6, through selective application of trim voltages across the trim cell diodes D1–D4 and trim currents through the trim cell fuses F1–F4. In this manner, the resistances R1–R4 of the trim cells 141–144 may be incrementally removed, beginning with the cell 141 closest to the adjust terminal $V_{ADJUST}$, as illustrated and described hereinafter with respect to FIGS. 7A–9B. Initially, a determination is made as to whether any trimming is required, and if so, the first cell 141 is trimmed, as illustrated in FIGS. 7A–7F. In the illustrated device 2, this involves measuring the reference voltage between the terminals $V_{OUT}$ and $V_{ADJUST}$. FIGS. 7A–7C illustrate removal (short-circuiting) of the first cell resistor R1 through application of a trim voltage of about 8 volts at about 600 mA across the terminals $V_{ADJUST}$ and $V_{OUT}$ with the terminal $V_{ADJUST}$ being held more positive than the terminal $V_{OUT}$. FIGS. 7D–7F illustrate subsequent disconnection of the first trim cell 141 from the terminal $V_{OUT}$ through application of a trim current of about 1A through the cell 141 to blow (e.g., open-circuit) the fuse F1.

FIG. 7B illustrates an exemplary tester 200, which may be employed to trim the trim circuit 102 after packaging of the voltage regulator device 2 in accordance with the invention, comprising appropriate electrical probes and connections to contact the input, output and adjust terminals $V_{IN}$, $V_{OUT}$, and $V_{ADJUST}$, respectively. The tester 200, moreover, is operative through appropriate adapters and connectors to interface with the device 2 regardless of package type, including but not limited to the package types illustrated in FIGS. 3A–3D above.

The tester 200 makes an initial determination of whether the reference voltage between the output and adjust pins $V_{OUT}$ and $V_{ADJUST}$ is greater than a desired value (e.g., 1.25 volts in the illustrated example). The tester 200 applies a DC voltage from a DC power source 202 across the input and adjust terminals $V_{IN}$ and $V_{ADJUST}$, respectively, (with the terminal $V_{IN}$ being held more positive than the terminal $V_{OUT}$) and measures the resulting reference voltage across the output and adjust terminals $V_{OUT}$ and $V_{ADJUST}$, respectively, using a digital volt meter (DVM) 208. Although illustrated in the context of measuring and adjusting a reference voltage by resistor trimming, any particular operational parameter of interest may be measured and adjusted according to the invention, wherein the tester 200 may comprise appropriate measurement apparatus to obtain a value for the parameter to be adjusted.

If trimming is needed, the tester 200 applies a trim voltage 204, such as about 8 volts DC across the adjust and output terminals $V_{ADJUST}$ and $V_{OUT}$ (e.g., with $V_{ADJUST}$ more positive than $V_{OUT}$), at a current of about 600 mA. This provides energy to the first zener diode D1 through a circuit path including the resistor R1, the diode D1, and the fuse F1, which operates to melt the conductive material of the contact 181 of the first trim cell 141 and/or the conductive metal of the first contact C1. The conductive material spikes through the PN junction of the diode D1 from the conductive portion 181 and melts from the contact C1 and is distributed along the length 151 of the first resistor R1 in the composite resistor body 114 as indicated in FIG. 7C. In the illustrated example, the trim voltage 204 is applied with $V_{ADJUST}$ more positive than $V_{OUT}$. However, it is noted that other implementations may short the resistor R1 by application of the trim voltage of an opposite polarity to that illustrated in FIG. 7B, and that all such alternative implementations are contemplated as falling within the scope of the present invention.

The first resistor R1 is effectively short-circuited (e.g., removed from the electrical path between the circuit node contacts C1 and C2) as a result of the melting and redistribution of conductive material along the length 151 of the resistor body 114. At this point, it is noted that the fuse F1 is sized to accommodate the current (e.g., about 600 mA) associated with application of the trim voltage 204 without blowing (e.g., fuse F1 remains intact during application of the trim voltage 204). With the resistor R1 and diode D1 effectively removed from the circuit 102, the total resistance between the circuit nodes C1 and C2 is the sum of the remaining trim resistors R2–R4 and the fixed resistor R5. In this regard, the fixed resistor R5 may be approximately 12 kOHMs, with the trim resistors R1–R4 being in the range of about 10–70 OHMs in the illustrated example. The circuit 102 as illustrated in FIGS. 7A and 7C now includes a short-circuit between node C1 (e.g., and the output terminal $V_{OUT}$) and the adjust terminal $V_{ADJUST}$, through the first fuse F1, which is subsequently removed through application of a trim current, as illustrated in FIGS. 7D–7F.

As illustrated in FIG. 7E, the tester 200 provides a trim current 206 between the terminals $V_{OUT}$ and $V_{ADJUST}$ of the device 2, such as about 1A, to open the first fuse F1. It is noted at this point, that the application of the trim current 206 provides enough current to open the fuse F1, but not enough energy to melt the diode D2 of the second trim cell 142. As a result, the circuit 102 thereafter appears as illustrated in FIGS. 7D and 7F, wherein the fuse F1 is open-circuited and the resistor R1 is short-circuited. At this point, the resistance between the nodes C1 and C2 is still the sum of resistors R2–R5, but the path of least resistance between the trim pads A and B is through the second trim cell 142 (e.g., the closest remaining trim cell to the terminal $V_{ADJUST}$).

A determination is then made as to whether further trimming is required in the circuit device 2, such as by again applying voltage from the power source 202 and measuring the resulting reference voltage across the terminals $V_{OUT}$ and $V_{ADJUST}$. If the measured reference voltage requires further adjustment, the resistance R2 of the next cell 142 is removed, as illustrated below in FIGS. 8A–8D. In removing R2, the operation of the tester 200 is similar to that described above with respect to FIGS. 7B and 7E in providing trim voltages and currents 204 and 206, respectively, to the trim circuit 102 using the terminals $V_{OUT}$ and $V_{ADJUST}$.

Figure 8A:
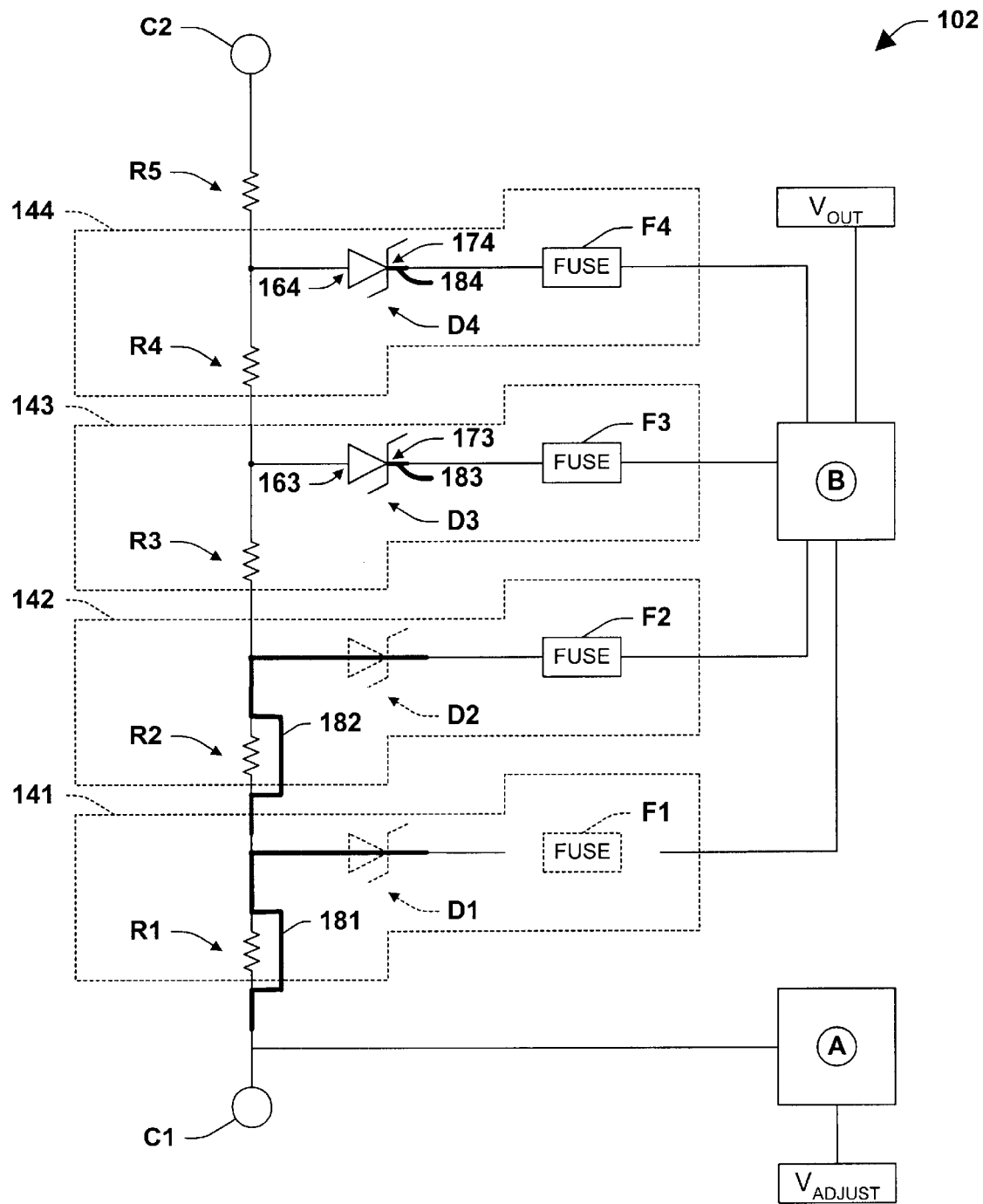
FIG. 8A is a schematic diagram illustrating the trim circuit of FIG. 7D with a second diode destroyed to short a second resistor.
Figure 8B:
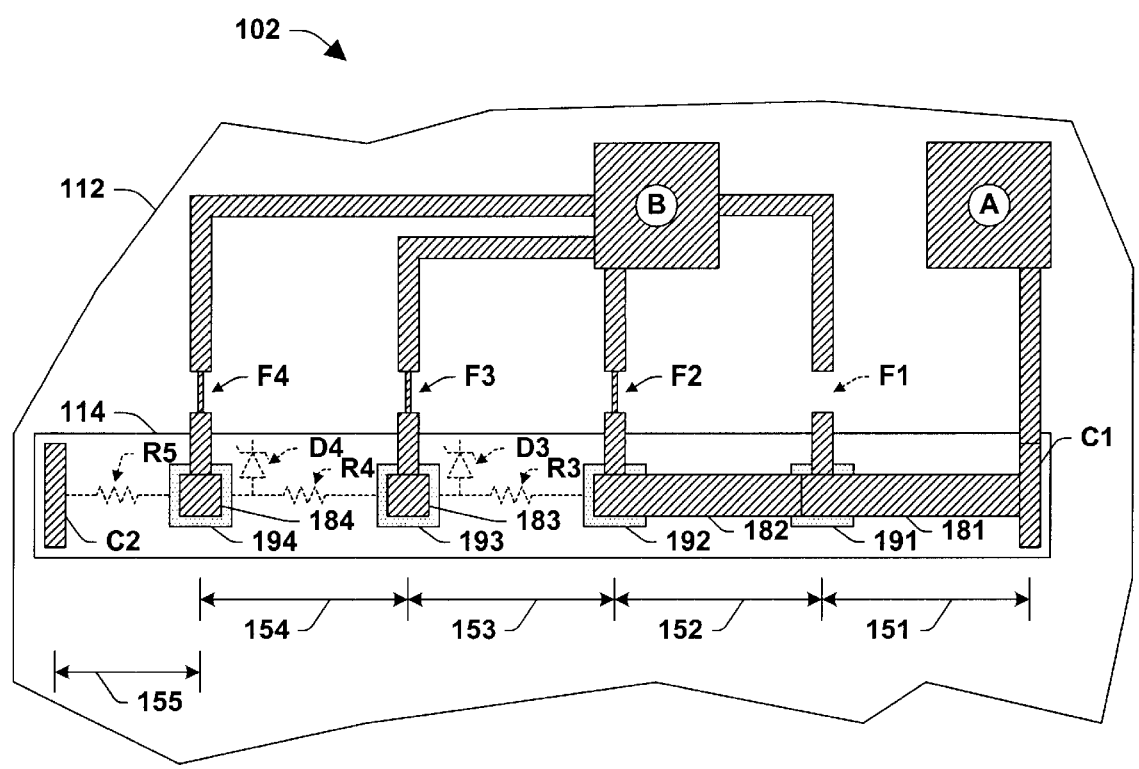
FIG. 8B is a partial top plan view illustrating the trim circuit of FIG. 7F with the second resistor short-circuited.
Figure 8C:
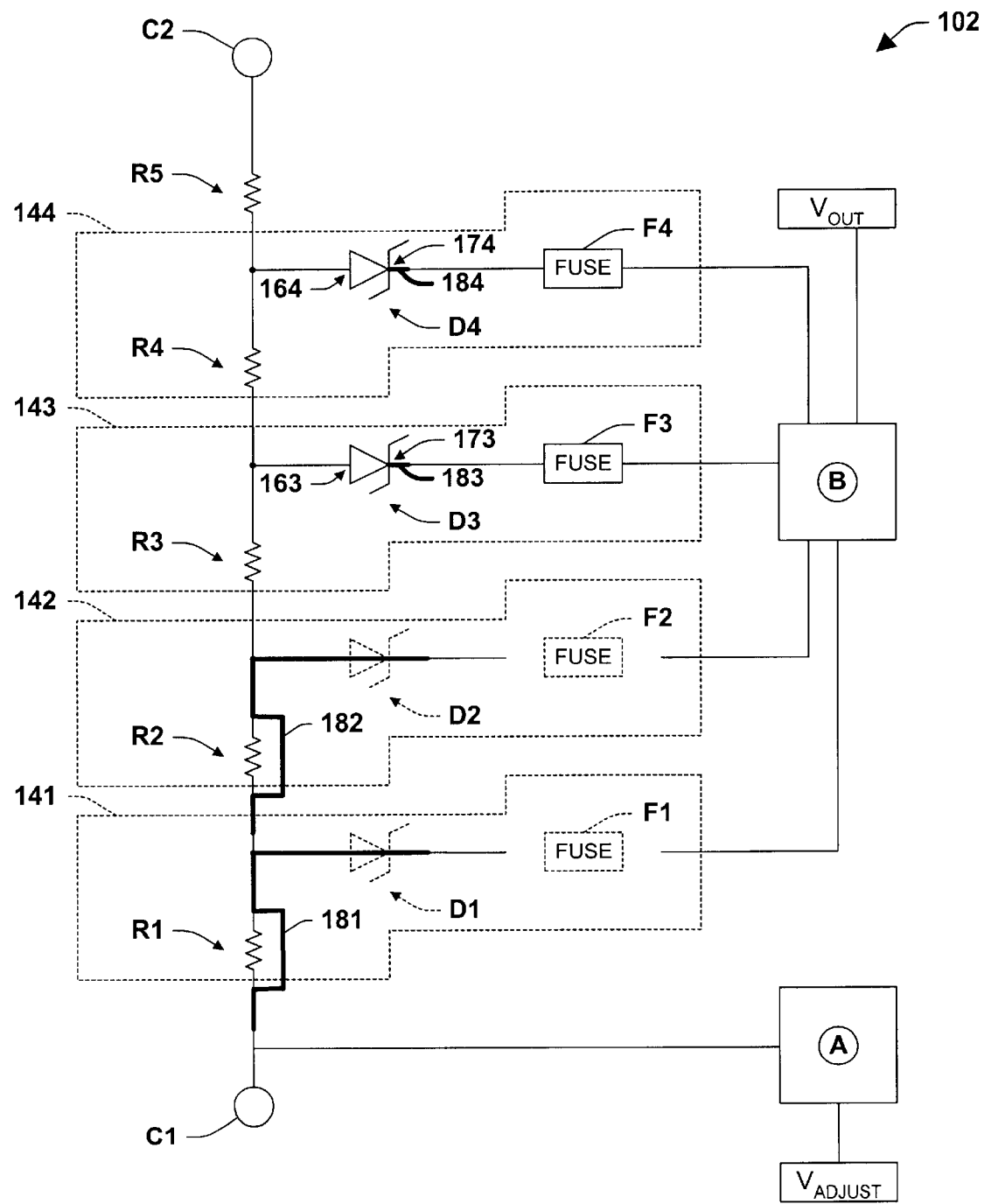
FIG. 8C is a schematic diagram illustrating the trim circuit of FIG. 8A with a second fuse opened to disconnect a second trim circuit from the second terminal.
Figure 8D:
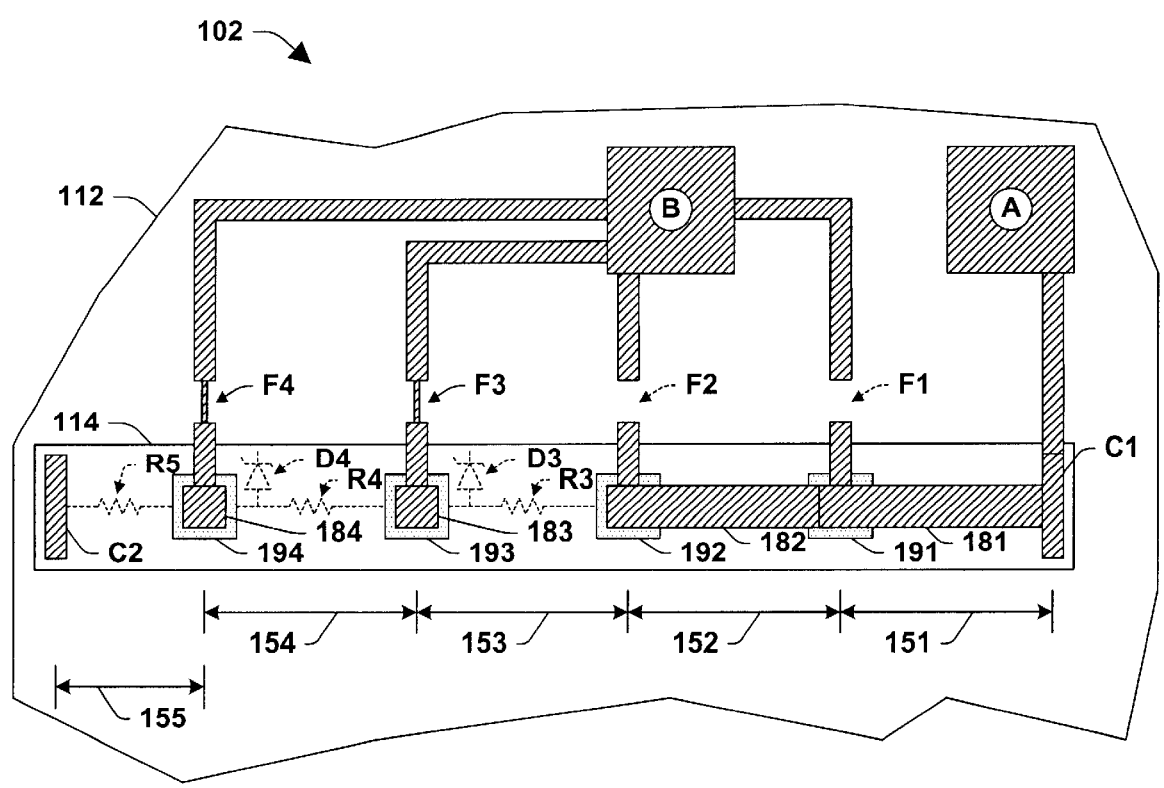
FIG. 8D is a partial top plan view illustrating the trim circuit of FIG. 8B with the second fuse opened.

In FIGS. 8A and 8B, a trim voltage 204 (FIG. 7B) is again applied between the terminals $V_{OUT}$ and $V_{ADJUST}$ (e.g., $V_{ADJUST}$ more positive than $V_{OUT}$), thereby shorting the second trim resistor R2. In this regard, the shorting of the second resistor R2 is similar in nature to that described above for the first resistor R1 and diode D1. This effectively removes R2 from the circuit 102, by which the total resistance between nodes C1 and C2 is now reduced to the sum of resistors R3–R5. Thereafter, as illustrated in FIGS. 8C and 8D, the tester 200 applies the trim current 206 (FIG. 7E) between the terminals $V_{OUT}$ and $V_{ADJUST}$, thereby opening the second cell fuse F2 and disconnecting the second trim cell 142 from the terminal $V_{OUT}$.

Figure 9A:
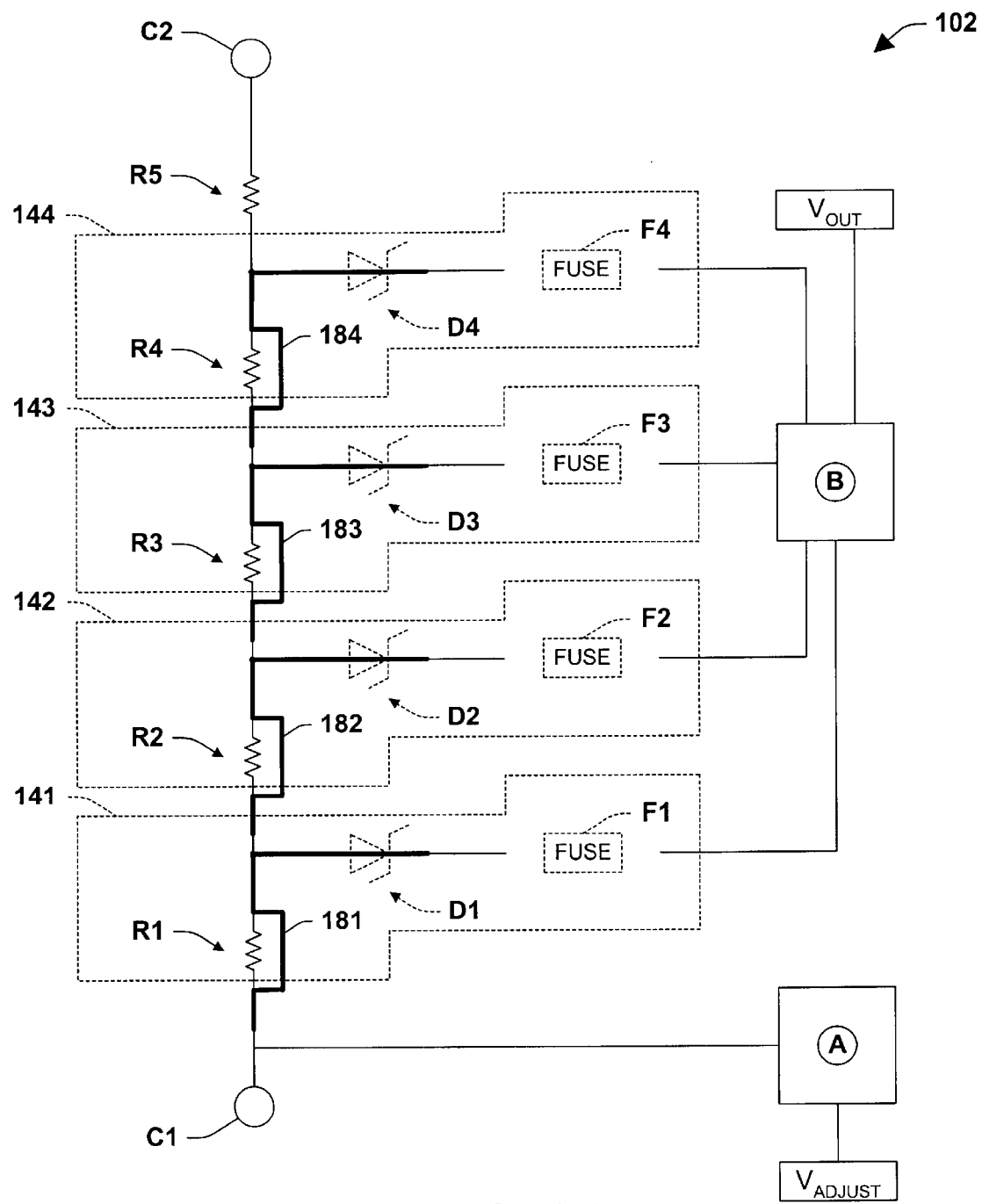
FIG. 9A is a schematic diagram illustrating the trim circuit with diodes and fuses of third and fourth trim cells destroyed to remove third and fourth resistances from the trim circuit.
Figure 9B:
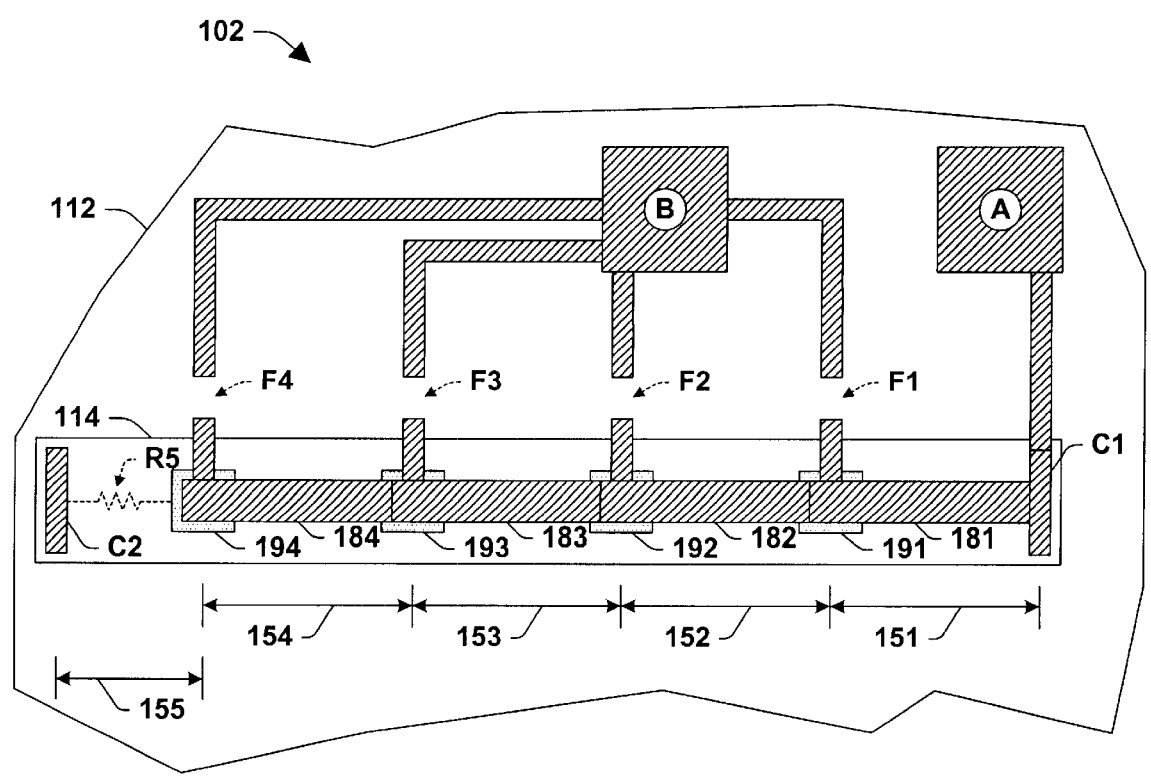
FIG. 9B is a partial top plan view illustrating the trim circuit of FIG. 9A with the third and fourth resistances removed.

This process is continued until the desired reference voltage value is achieved between terminals $V_{OUT}$ and $V_{ADJUST}$. Thus, none, some, or all of the trim cells 141–144 may be incrementally removed from the trim circuit 102, wherein the latter case is illustrated in FIGS. 9A and 9B. In the case of a voltage regulator device 2, such as an LM317 type device, the output terminal $V_{OUT}$ will always be within about 1.25 volts of the adjust terminal $V_{ADJUST}$ during normal operation. In this regard, it is noted that any remaining trim cells 141–144 in the trim circuit 102 will not conduct between the terminals $V_{OUT}$ and $V_{ADJUST}$ because the diodes D1–D4 thereof will be reverse biased. In the illustrated example, the zener voltages of the diodes D1–D4 are in the range of about 5.8–7.2 volts. Thus, the invention advantageously facilitates use of the output terminal $V_{OUT}$ in postpackaging, multi-bit trimming of the reference voltage, without adversely affecting the operation of the finished regulator device 2.

As illustrated in FIGS. 9A and 9B, the trim circuit 102 has all of the trim resistors R1–R4 effectively short-circuited. This is accomplished through four applications of the trim voltage 204 across the terminals $V_{OUT}$ and $V_{ADJUST}$, with intervening applications of the trim current 206 therebetween to open the fuses F1–F4. The resulting circuit 102 in FIGS. 9A and 9B thus provides a total resistance between the nodes C1 and C2 roughly equal to the fixed resistor R5. It is noted at this point, that the shorting of the trim resistors R1–R4 effectively removes most if not all of the corresponding electrical resistances associated therewith, although some residual resistance may remain. In this case, the resistance between C1 and C2 in FIGS. 9A and 9B may be the sum of R5 and such residual resistances.

Figure 10:
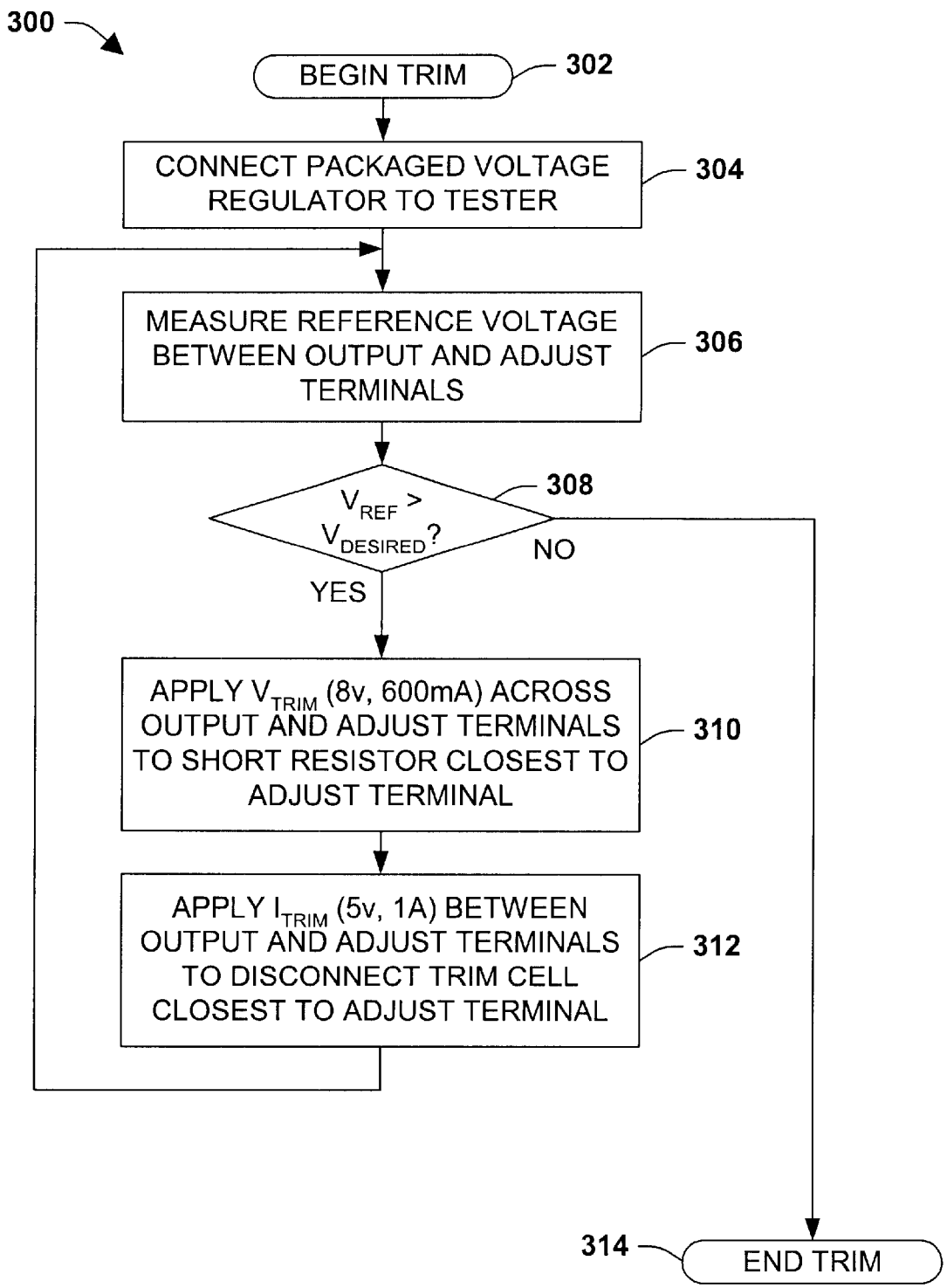
FIG. 10 is a flow diagram illustrating an exemplary method in accordance with another aspect of the invention.

Referring now to FIG. 10, another aspect of the invention provides methods for selectively removing resistance between first and second nodes in a packaged electrical device. An exemplary method 300 is illustrated and described below, which may be employed in adjusting an operational parameter of a device having first and second terminals and first and second trim cells comprising first and second resistors serially connected between the first and second circuit nodes thereof, where first and second diodes connect the first and second trim cells to the second terminal, respectively. The methods of the invention generally comprise applying a trim voltage across the first and second terminals to short the first resistor, and applying a trim current between the first and second terminals to disconnect the first trim cell from the second terminal.

Although the method 300 is illustrated and described below as a series of acts or events, it will be appreciated that the present invention is not limited by the illustrated ordering of such acts or events. For example, some acts may occur in different orders and/or concurrently with other acts or events apart from those illustrated and/or described herein, in accordance with the invention. In addition, not all illustrated steps may be required to implement a methodology in accordance with the present invention. Furthermore, the methods according to the present invention may be implemented in association with trimming or adjustment operations using the trim circuitry illustrated and described herein as well as in association with other devices not illustrated.

Beginning at 302, a packaged electrical device, such as a voltage regulator, is connected to a tester at 304. For example, the input, output, and adjust terminals $V_{IN}$, $V_{OUT}$, and $V_{ADJUST}$, respectively, of the exemplary regulator device 2 described above may be connected to a tester 200, as illustrated in FIGS. 7B and 7E above. At 306, a performance parameter is measured, such as by measuring the reference voltage between output and adjust terminals of a voltage regulator. A determination is made at 308 as to whether the measured operating parameter is within allowable tolerances. For instance, a measured reference voltage $V_{REF}$ may be compared with a desired voltage $V_{DESIRED}$ at 308. If further trimming is desired (YES at 308), a trim voltage $V_{TRIM}$ is applied to the adjust and output terminals at 310 to short-circuit the trim resistor closest to the adjust terminal. For instance, in trimming the circuit 102 above, the initial application of the trim voltage 204 of FIG. 7B short-circuits the resistor R1 of the first trim cell 141.

After the resistor is shorted at 310, a trim current $I_{TRIM}$ is applied between the terminals at 312, in order to disconnect the nearest remaining trim cell from the adjust terminal. In the voltage regulator example above, the initial application of the trim current 206 of FIG. 7E opens the first fuse F1 of the cell 141, by which the trim cell 141 is disconnected from the output terminal $V_{OUT}$, leaving the circuit as illustrated in FIGS. 7D and 7F. Thereafter at 306, the operating parameter is again measured, and a determination is made at 308 as to whether further trimming is desired according to the measured operating parameter. If further trimming is desired, a second trim voltage is applied across the terminals at 310 to short a second trim resistor (e.g., resistor R2 in the device 2 above), and a second trim current is applied at 312 to disconnect the second trim cell from the adjust terminal. The method 300 continues in this fashion until the desired operational parameter (e.g., reference voltage value) is obtained (e.g., NO at 308), after which the method 300 ends at 314.

Although the invention has been illustrated and described with respect to one or more implementations, equivalent alterations and modifications will occur to others skilled in the art upon the reading and understanding of this specification and the annexed drawings. In particular regard to the various functions performed by the above described components (assemblies, devices, circuits, systems, etc.), the terms (including a reference to a "means") used to describe such components are intended to correspond, unless otherwise indicated, to any component which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising."

What is claimed is:

1. An electrical device, comprising:
   an electrical circuit comprising a plurality of electrical components fabricated in a substrate and interconnected with one another;
   first and second electrical terminals connected to first and second nodes, respectively in the electrical circuit, the first and second electrical terminals individually providing external connectivity to the first and second nodes; and
   a trim circuit comprising a plurality of trim cells fabricated in the substrate, the trim cells individually providing resistance between the first and second nodes in the electrical circuit, the resistance of the individual trim cells being selectively removable by application of at least one trim signal to the first and second electrical terminals to reduce resistance between the first and second nodes.

2. The electrical device of claim 1, wherein the electrical device is a voltage regulator comprising an output terminal and an adjust terminal, and wherein the resistance of the individual trim cells are selectively removable by application of trim signals to the output and adjust terminals to reduce resistance between the first and second nodes.

3. The electrical device of claim 2, wherein the trim cells individually comprise:
   a resistor providing a resistance between the first and second nodes; and
   a diode comprising an anode connected to an end of the resistor, a cathode, and a conductive portion connected to the cathode, the conductive portion electrically shorting the resistor after a trim voltage is applied across the output and adjust terminals.

4. The electrical device of claim 3, wherein the trim cells individually comprise a fuse connected between the conductive portion of the diode and the output terminal to selectively disconnect the cathode from the output terminal after a trim current is applied between the output and adjust terminals.

5. The electrical device of claim 4, wherein the fuse disconnects the corresponding cathode from the output terminal after a trim current of about 1A is applied between the output and adjust terminals.

6. The electrical device of claim 3, wherein the conductive portion electrically shorts the resistor after a trim voltage of about 8 volts at about 600 mA is applied across the output and adjust terminals.

7. The electrical device of claim 1, wherein the trim cells individually comprise:
   a resistor comprising first and second ends and providing a resistance between the first and second nodes;
   a diode comprising an anode connected to the second end of the resistor, a cathode, and a conductive portion connected to the cathode, the conductive portion electrically shorting the resistor after a trim voltage is applied across the first and second terminals.

8. The electrical device of claim 7, wherein the trim cells individually comprise a fuse connected between the conductive portion of the diode and the second terminal to selectively disconnect the cathode from the second terminal after a trim current is applied between the first and second terminals.

9. The electrical device of claim 1, wherein the individual trim cells comprise a resistance connected between the first and second nodes and a conductive portion adapted to electrically short the resistor after application of a trim voltage of about 8 volts at about 600 mA across the first and second terminals.

10. The electrical device of claim 1, wherein the individual trim cells comprise a fuse adapted to disconnect the trim cell from the second terminal after application of a trim current of about 1A between the first and second terminals.

11. The electrical device of claim 1, wherein the trim circuit comprises:
    a first trim cell connected to the first node and to the first and second terminals; and
    a second trim cell connected between the first trim cell and the second node;
    wherein the first and second trim cells individually comprise:
       a resistor comprising a resistor body extending in the substrate between first and second ends and providing an electrical resistance between the first and second nodes; and
       a diode formed in the resistor body, the diode comprising an anode connected to the second end of the resistor, a cathode connected to the second terminal, and a conductive portion connected to the cathode, the conductive portion connecting the first and second ends of the resistor to remove resistance between the first and second nodes after a trim voltage is applied across the first and second terminals.

12. The electrical device of claim 11, wherein the first and second trim cells individually comprise a fuse connected between the cathode and the second terminal, the fuse disconnecting the cathode from the second terminal after a trim current is applied between the first and second terminals.

13. The electrical device of claim 12, wherein the trim circuit further comprises a fixed resistor connected between the second trim cell and the second node.

14. The electrical device of claim 12, wherein resistor bodies of the first and second trim cells are individually doped with a dopant of a first type, wherein the diodes of the first and second trim cells individually comprise a diode body portion in the resistor body near the second end of the resistor, the diode body portion being doped with a dopant of a second type, wherein the first and second dopant types are different from one another.

15. The electrical device of claim 14, wherein conductive portions of the diodes in the first and second trim cells individually comprise a conductive contact structure formed over the diode body portion, the conductive contact structure being connected to the second terminal through the fuse, and wherein application of the trim voltage across the first and second terminals melts the conductive contact structure and distributes conductive material from the conductive contact structure along the resistor body between the first and second ends to connect the first and second ends of the resistor.

16. The electrical device of claim 15, wherein an initial application of the trim voltage across the first and second terminals melts the conductive contact structure of the first trim cell to remove the electrical resistance associated with the first trim cell from the trim circuit, and wherein an initial application of the trim current between the first and second terminals following application of the initial trim voltage disconnects the first trim cell from the second terminal.

17. The electrical device of claim 16, wherein a subsequent application of the trim voltage across the first and second terminals following the initial application of the trim current melts the conductive contact structure of the second trim cell to remove the electrical resistance associated with the second trim cell from the trim circuit, and wherein a subsequent of the trim current between the first and second terminals following application of the subsequent trim voltage disconnects the second trim cell from the second terminal.

18. An electrical device, comprising:
an electrical circuit comprising a plurality of interconnected electrical components and first and second nodes;
first and second trim pads connected to the electrical circuit; and
a trim circuit comprising first and second trim cells providing selectively removable resistance between the first and second nodes, wherein individual resistances of the first and second trim cells are selectively removable by application of a trim signal to the first and second trim pads to reduce resistance between the first and second nodes.

19. The electrical device of claim 18, wherein the electrical device is a voltage regulator comprising an output terminal connected to the second trim pad and an adjust terminal connected to the first trim pad, and wherein resistances of the first and second trim cells are selectively removable by application the trim signal to the output and adjust terminals.

20. The electrical device of claim 18, wherein the first and second trim cells individually comprise a resistor providing a resistance between the first and second nodes, and a diode comprising an anode connected to an end of the resistor, a cathode, and a conductive portion connected to the cathode, the conductive portion electrically shorting the resistor after a trim voltage is applied across the first and second trim pads.

21. The electrical device of claim 20, wherein the first and second trim cells individually comprise a fuse connected between the conductive portion of the diode and the second trim pad to selectively disconnect the cathode from the second trim pad after a trim current is applied between the first and second trim pads.

22. A method of selectively removing resistance between first and second nodes in a packaged electrical device having first and second terminals and first and second trim cells comprising first and second resistors serially connected between the first and second nodes, and first and second diodes connecting the first and second trim cells to the second terminal, respectively, the method comprising:
applying a trim voltage across the first and second terminals to short the first resistor; and
applying a trim current between the first and second terminals to disconnect the first trim cell from the second terminal.

23. The method of claim 22, comprising:
measuring an operating parameter associated with the electrical device;
determining if further trimming is desired according to the measured operating parameter; and
if further trimming is desired, applying a second trim voltage across the first and second terminals to short the second resistor, and applying a second trim current between the first and second terminals to disconnect the second trim cell from the second terminal.

24. The method of claim 23, wherein the electrical device is a voltage regulator, wherein the first terminal comprises an adjust terminal, wherein the second terminal comprises an output terminal, and wherein measuring the operating parameter associated with the electrical device comprises measuring a reference voltage between the output terminal and the adjust terminal in the voltage regulator.

25. The method of claim 22, wherein applying the trim voltage comprises melting a conductive portion of the first diode to short-circuit the first resistor.

26. The method of claim 22, wherein applying the trim current comprises open-circuiting a fuse between the first trim cell and the second terminal to disconnect the first trim cell from the second terminal.

* * * * *